(12) United States Patent  
Kawabata et al.

(10) Patent No.: US 7,002,839 B2  
(45) Date of Patent: Feb. 21, 2006

(54) MAGNETIC RING UNIT AND MAGNETIC MEMORY DEVICE

(75) Inventors: Makoto Kawabata, Kanagawa (JP); Kazuya Harii, Kanagawa (JP); Eiji Saitoh, Kanagawa (JP); Hideki Miyajima, Kanagawa (JP)

(73) Assignee: Keio University, Tokyo (JP)

( * ) Notice: Subject to any disclaimer, the term of this patent is extended or adjusted under 35 U.S.C. 154(b) by 126 days.

(21) Appl. No.: 10/827,366

(22) Filed: Apr. 20, 2004

(65) Prior Publication Data

US 2004/0213039 A1    Oct. 28, 2004

(30) Foreign Application Priority Data

Apr. 23, 2003    (JP)    ............................. 2003-118198

(51) Int. Cl.  
    *G11C 11/00*    (2006.01)
(52) U.S. Cl. ..................... 365/171; 365/173; 365/66; 365/51; 365/55
(58) Field of Classification Search ................ 365/171, 365/173, 66, 51, 55  
See application file for complete search history.

(56) References Cited

U.S. PATENT DOCUMENTS

| | | | | |
|---|---|---|---|---|
| 5,541,868 A | * | 7/1996 | Prinz ........................... | 365/98 |
| 6,391,483 B1 | * | 5/2002 | Zhu et al. .................... | 428/810 |
| 6,906,369 B1 | * | 6/2005 | Ross et al. ................... | 257/295 |
| 6,927,073 B1 | * | 8/2005 | Huggins ........................ | 438/3 |
| 6,936,479 B1 | * | 8/2005 | Sharma ......................... | 438/3 |
| 6,950,332 B1 | * | 9/2005 | Yamamoto et al. .......... | 365/158 |
| 2002/0182557 A1 | * | 12/2002 | Kuriyama et al. ........... | 432/124 |
| 2004/0136558 A1 | * | 7/2004 | Usuki et al. ................. | 381/394 |
| 2004/0165426 A1 | * | 8/2004 | Yamamoto et al. .......... | 365/171 |
| 2004/0166640 A1 | * | 8/2004 | Yagami et al. .............. | 438/277 |

FOREIGN PATENT DOCUMENTS

| | | |
|---|---|---|
| JP | 2001-84758 | 3/2001 |
| JP | 2002-299584 | 10/2002 |
| JP | 2003-31776 | 1/2003 |

OTHER PUBLICATIONS

J.-G. Zhu, et al.; "Ultrahigh density vertical magnetoresistive random access memory (invited)"; *Journal of Applied Physics*; vol. 87; No. 9; May 1, 2000; pp. 6668-6673./Discussed in the specification.

M. Kläui et al.; Vortex circulation control in mesoscopic ring magnets; *Applied Physics Letters*; vol. 78; No. 21; May 21, 2001; pp. 3268-3270./Discussed in the specification.

M. Schneider, et al.; "Magnetic switching of single vortex permalloy elements" *Applied Physics Letters*; vol. 79; No. 19; Nov. 5, 2001; pp. 3113-3115.

R. Nakatani, et al; "Magnetization Reversal with In-Plane Magnetic Field in Asymmetric Ring Dots"; *Japanese Journal of Applied Physics*; vol. 42; No. 1; Jan. 2003; pp. 100-101.

* cited by examiner

*Primary Examiner*—Viet Q. Nguyen  
(74) *Attorney, Agent, or Firm*—Armstrong, Kratz, Quintos, Hanson & Brooks, LLP.

(57) ABSTRACT

The present invention relates to a magnetic ring unit and a magnetic memory device; an object of the invention is to control the direction of rotation of the magnetic flux freely and with high reproducibility in a simple structure without using a thermal process such as pinning; and a magnetic ring unit is formed of a magnetic ring in eccentric ring form where the center of the inner diameter is located at a decentered position relative to the center of the outer diameter.

3 Claims, 11 Drawing Sheets

Diagrams describing the configuration according to the principles of the present invention 1: Magnetic ring  2: Magnetic domain wall  3: Magnetic domain wall Diagrams describing the configuration
according to the principles of the present invention 1: Magnetic ring   2: Magnetic domain wall   3: Magnetic domain wall Views describing the steps halfway through the manufacturing of a magnetic ring unit according to the first embodiment of the present 11: Silicon substrate
12: Photoresist layer
13: Recess in ring form
14: Protrusion
15: NiFe layer Views describing the steps following Fig 2(c) of the manufacturing of the magnetic ring unit according to the first embodiment of the present invention 11: Silicon substrate    16: Magnetic ring unit Diagrams describing the principles of control of the direction of rotation of the magnetic moment in the magnetic ring unit according to the first embodiment of the present invention 16: Magnetic ring unit
17: Magnetic domain wall
18: Magnetic domain wall
19: Domain with broad ring width
20: Domain with narrow ring width Graph describing the hysteresis characteristics of the magnetic ring unit according to the first embodiment of the present invention Graph describing the hysteresis characteristics of a non-eccentric magnetic ring unit according to the prior art

FIG. 7

Schematic cross-sectional view showing a main portion of an MRAM according to the second embodiment of the present invention

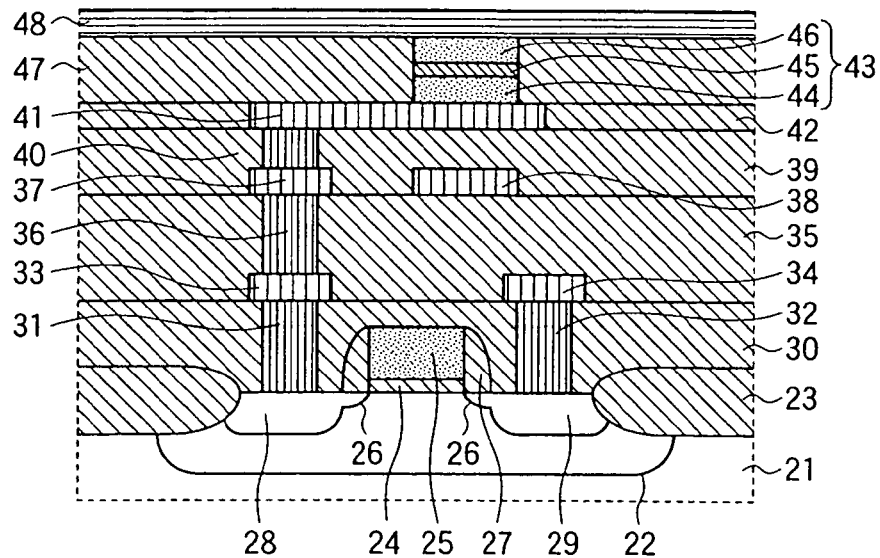

- 21: n-type silicon substrate
- 22: p-type well region
- 23: Element isolation oxide film
- 24: Gate insulating film
- 25: Sense line
- 26: n⁻-type LDD region
- 27: Sidewall
- 28: n⁺-type drain region
- 29: n⁺-type source region
- 30: First interlayer insulating film
- 31: W plug
- 32: W plug
- 33: Connecting conductor
- 34: Ground line
- 35: Second interlayer insulating film
- 36: W plug
- 37: Connecting conductor
- 38: Word line
- 39: Third interlayer insulating film
- 40: W plug
- 41: Lower electrode
- 42: Fourth interlayer insulating film
- 43: Magnetic ring unit
- 44: NiFe layer
- 45: Tunnel insulating film
- 46: CoFe layer
- 47: Fifth interlayer insulating film
- 48: Bit line Diagrams describing the circuit configuration of the MRAM according to the second embodiment of the present invention 25: Sense line
28: n⁺-type drain region
38: Word line
43: Magnetic ring unit
44: NiFe layer 45: Tunnel insulating film
46: CoFe layer
48: Bit line
49: Access transistor
50: Sense amplifier Diagrams describing write-in and read-out operations in the MRAM according to the second embodiment of the present invention 25: Sense line    48: Bit line
38: Word line    49: Access transistor
43: Magnetic ring unit    50: Sense amplifier Diagram showing a conceptual configuration of magnetic moment distribution in a nanoring unit Diagrams describing the conversion from the opposed domain structure to the magnetic vortex structure in the nanoring unit (a)

External magnetic field (b)

(c)

MAGNETIC RING UNIT AND MAGNETIC MEMORY DEVICE

TECHNICAL FIELD

The present invention relates to a magnetic ring unit and a magnetic memory device, and in particular, to a magnetic ring unit and a magnetic memory device characterized by the configuration for controlling the direction of rotation of magnetization of the magnetic ring unit with high reproducibility.

BACKGROUND ART

In recent years, a dramatic increase in the density and miniaturization of magnetic recording medium and magnetic memory device have progressed as a result of the development of a microscopic processing technology and the recording density has approximately arrived at a theoretical limit.

The direction of local magnetic moment M of a magnetic body corresponds to digital data of either "0" or "1" in such a magnetic recording medium or magnetic memory device.

A magnetic random access memory device (MRAM), which is an example of a magnetic memory device, is a memory device utilizing a change in the resistance value depending on the direction of the spin of electrons in a magnetic body as a result of a current flow in the magnetic structure, wherein GMR (giant magnetoresistance) elements or TMR (tunneling magnetoresistance) elements have been examined concerning the magnetic structure for the formation of memory cells [see for example, Japanese Unexamined Patent Publication 2003-031776 (Patent document 1) or Japanese Unexamined Patent Publication 2002-299584 (Patent document 2)].

Here, a great resistance change has been required in such an MRAM and therefore, the TMR element structure is primarily used in research and development.

When such a magnetic memory device or magnetic recording medium is formed by integrating magnetic units with a high density, the magnetic units are aligned in proximity to each other in the configuration of the magnetic memory device or magnetic recording medium, wherein the magnetostatic energy becomes the minimum when the opposite poles are alternately aligned in the case where the poles of magnetic bodies, that is to say N poles and S poles, are placed in proximity to each other.

The magnetic pole alignments other than the above gradually transit to the minimum energy condition due to thermal disturbance or as a result of a tunnel phenomenon and thereby, the recorded data disappears.

This disappearance of the recorded data in course of time is a critical defect in the magnetic recording medium or magnetic memory device and therefore, it is necessary to reduce as much as possible the magnetic interaction between magnetic units that hold data in order to prevent the above described disappearance of the recorded data due to the magnetic interaction.

As one effective method for the above, usage of nanoscale magnetic bodies in ring form, that is to say, usage of nanoring units as the recording units has been proposed [see for example, Japanese Unexamined Patent Publication 2001-084758 (Patent document 3) or Journal of Applied Physics, Vol. 87, No. 9, pp. 6668–6673, May $1^{st}$, 2000 (Non-patent document 1)].

See FIG. 10.

FIG. 10 is a diagram showing a conceptual configuration of a nanoring unit, wherein the nanoring unit is a ring with a diameter of approximately 100 nm fabricated from a ferromagnetic body such as permalloy (NiFe alloy) having a small magnetic anisotropy where a magnetic vortex structure (magnetic flux closure domain) is formed so as to contain magnetic flux indicated by arrows inside.

In such a magnetic vortex structure, the clockwise direction and the counterclockwise direction of magnetic flux have equal energy and therefore, magnetic memory cells are formed in a manner where the direction of rotation corresponds to digital data of either "0" or "1."

This magnetic vortex structure does not have flux leakage where magnetic interaction between nanoring units is extremely small and accordingly, the data written in a nanoring unit is stably retained even in the case where nanoring units are aligned with a high density allowing the achievement of a recording density of approximately 400 $Gbit/in^2$ ($\approx 62$ $Gbit/cm^2$) which is a recording density ten times, or more, higher than the present recording density.

As described above, a ferromagnetic nanoring unit has excellent characteristics as a magnetic recording medium or magnetic memory device while the clockwise direction and counterclockwise direction of flux have equal energy and therefore, it is necessary to control the direction of rotation of magnetic flux for practical usage.

See FIGS. 11(a) to 11(c).

This is because whether the counterclockwise direction shown in FIG. 11(b) or the clockwise direction shown in FIG. 11(c) is gained cannot be controlled by adjusting energy during the process of conversion of the opposed domain structure formed by applying the external magnetic field shown in FIG. 11(a) into the magnetic vortex structure when the magnetic field is reduced to 0.

Thus, in the above described Patent document 3, a nonmagnetic conductor is provided in order to penetrate through the center of a ferromagnetic nanoring unit and the direction of rotation is regulated by the direction of current that flows through this non-magnetic conductor.

In addition, an antiferromagnetic pattern is locally provided at a position that shifts from the rotational symmetry on the surface of the ferromagnetic nanoring unit so that the direction of magnetization of the pinned layer is fixed due to the direction of magnetization provided to this antiferromagnetic pattern.

In addition, another method has been proposed wherein a constriction, or the like, is provided in a nanoring so that the direction of rotation is controlled by pinning magnetic domain walls [see for example, Applied Physics Letters, Vol. 78, No. 21, pp. 3268–3270, May $21^{st}$, 2001 (Non-patent document 2)].

In the above described Patent document 1, however, it is necessary to make the insulation between a feed-through conductor and a nanoring complete, and to do so, it is necessary for an insulating film without a pinhole to be formed so as to have a sufficient thickness that can prevent a tunnel phenomenon and in addition a problem arises where an antiferromagnetic pattern is required.

In addition, a problem arises in the above described Non-patent document 2 where a unit is thermally agitated as a result of the utilization of effects of pinning magnetic domain walls and therefore, a stable operation cannot be expected at room temperature.

Accordingly, an object of the present invention is to control the direction of rotation of the magnetic flux freely and with high reproducibility in a simple structure where a thermal process such as pinning is not used.

DISCLOSURE OF THE INVENTION

FIGS. 1(a) and 1(b) are diagrams describing the configuration according to the principles of the present invention and the means for solving the problem according to the present invention is described in reference to these FIGS. 1(a) and 1(b).

See FIGS. 1(a) and 1(b).

(1) According to the present invention, a magnetic ring unit is characterized by having at least a magnetic ring 1 in eccentric ring form wherein the center of the inner diameter is located at a decentered position relative to the center of the outer diameter.

In such a magnetic ring 1 in eccentric ring form, as shown in FIGS. 1(a) and 1(b), the magnetic domain walls 2 and 3 shift in the direction toward the portion with a narrow ring width during the process of conversion from the opposed domain structure formed by applying an external magnetic field into the magnetic vortex structure when the magnetic field is reduced to 0 and therefore, the magnetic vortex structure rotates in the direction of the magnetic moment on the side with a broad ring width so that the direction of rotation can be controlled with high reproducibility by the direction of application of the external magnetic field.

(2) In addition, according to the present invention, the above described (1) is characterized in that the magnetic ring 1 in eccentric ring form is made up of a pair of magnetic rings having coercive forces that are different from each other and in that a non-magnetic layer is intervened between the pair of magnetic rings.

In this manner, a layered structure is formed of magnetic ring/non-magnetic layer/magnetic ring where the coercive forces of the pair of magnetic rings are different from each other and thereby, a magnetic sensor or magnetic memory cell can be formed.

Here, in this case a GMR element can be gained by forming the non-magnetic layer of a conductive layer such as Cu, Au, Cr, or the like; and a TMR element can be gained by forming the non-magnetic layer of a tunnel insulating film such as $Al_2O_3$, $SiO_2$, or the like.

(3) In addition, according to the present invention, a magnetic memory device that is provided with: magneto-resistive memory elements on a semiconductor substrate, which are respectively placed in intersection regions of word lines and bit lines placed in the directions crossing each other and where first magnetic layers, of which the direction of rotation of magnetization is variable, and second magnetic layers, of which the direction of rotation of magnetization is fixed, are layered via non-magnetic intermediate layers; and access transistors of which the gates are sense lines placed in the direction that crosses the bit lines, is characterized in that each of the magneto-resistive memory element is formed at least of: a first magnetic ring 1 in eccentric ring form where the center of the inner diameter is located at a decentered position relative to the center of the outer diameter; a second magnetic ring in eccentric ring form having a coercive force greater than that of first magnetic ring 1; and a non-magnetic layer provided between the first and the second magnetic rings.

A magnetic ring unit formed of magnetic ring/non-magnetic layer/magnetic ring is used as a magneto-resistive memory element in the above described manner and thereby, a magnetic memory device with a high recording density, which is highly reliable, can be implemented without requiring a complicated configuration or a thermal process.

BRIEF DESCRIPTION OF THE DRAWINGS

FIG. 7 is a schematic cross-sectional view showing a main portion of an MRAM according to the second embodiment of the present invention;

BEST MODE FOR CARRYING OUT THE INVENTION

Figure 1:
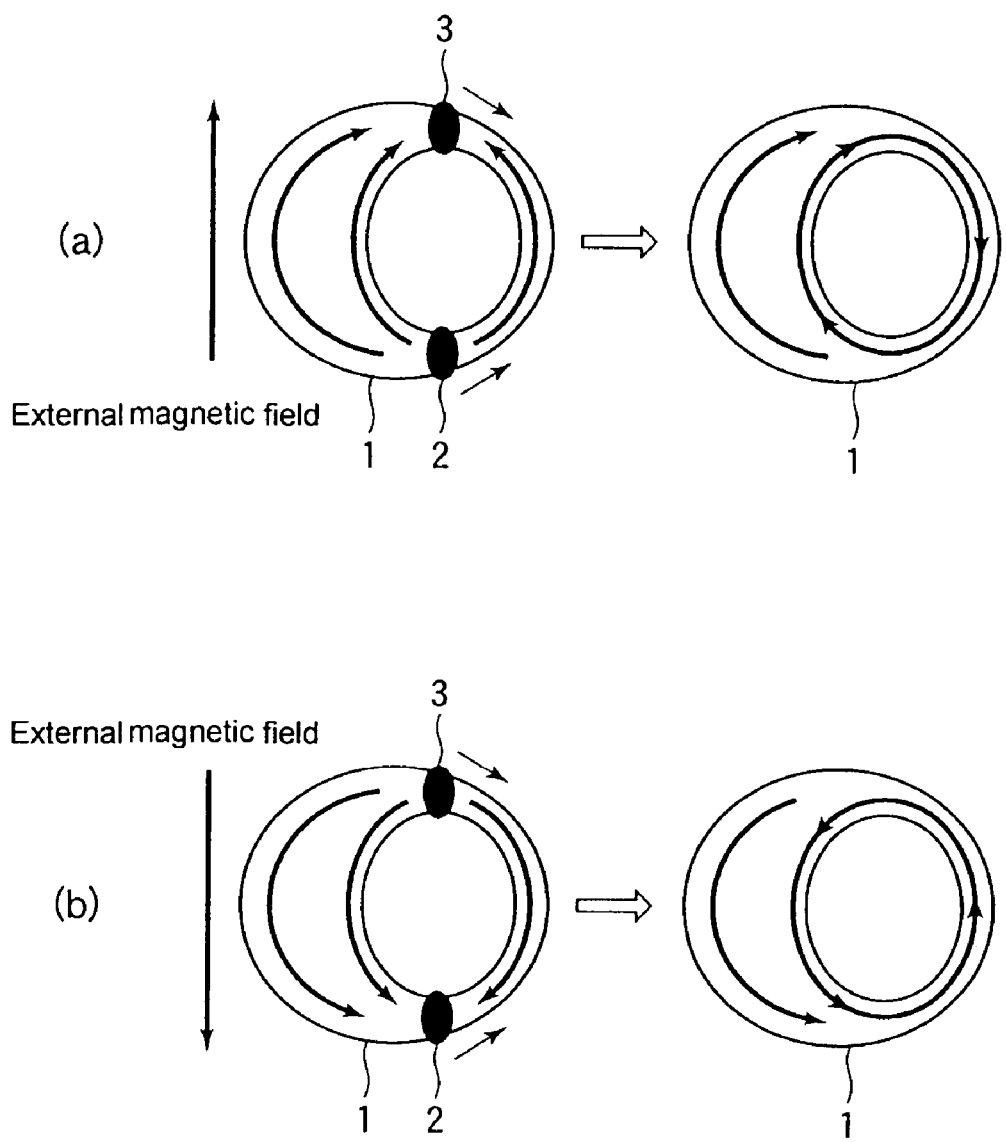
FIGS. 1(a) and 1(b) are diagrams describing the configuration according to the principles of the present invention.
Figure 2:
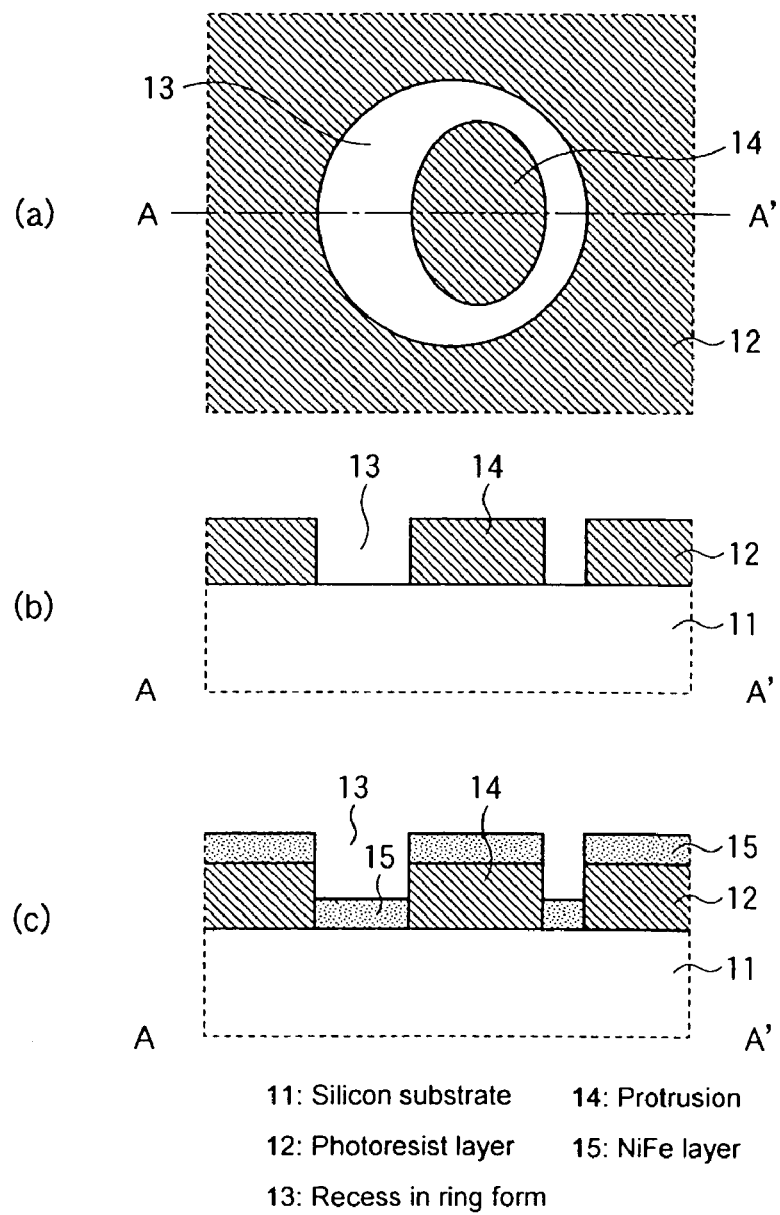
FIGS. 2(a) to 2(c) are views describing the steps halfway through the manufacturing of a magnetic ring unit according to the first embodiment of the present invention.
Figure 3:
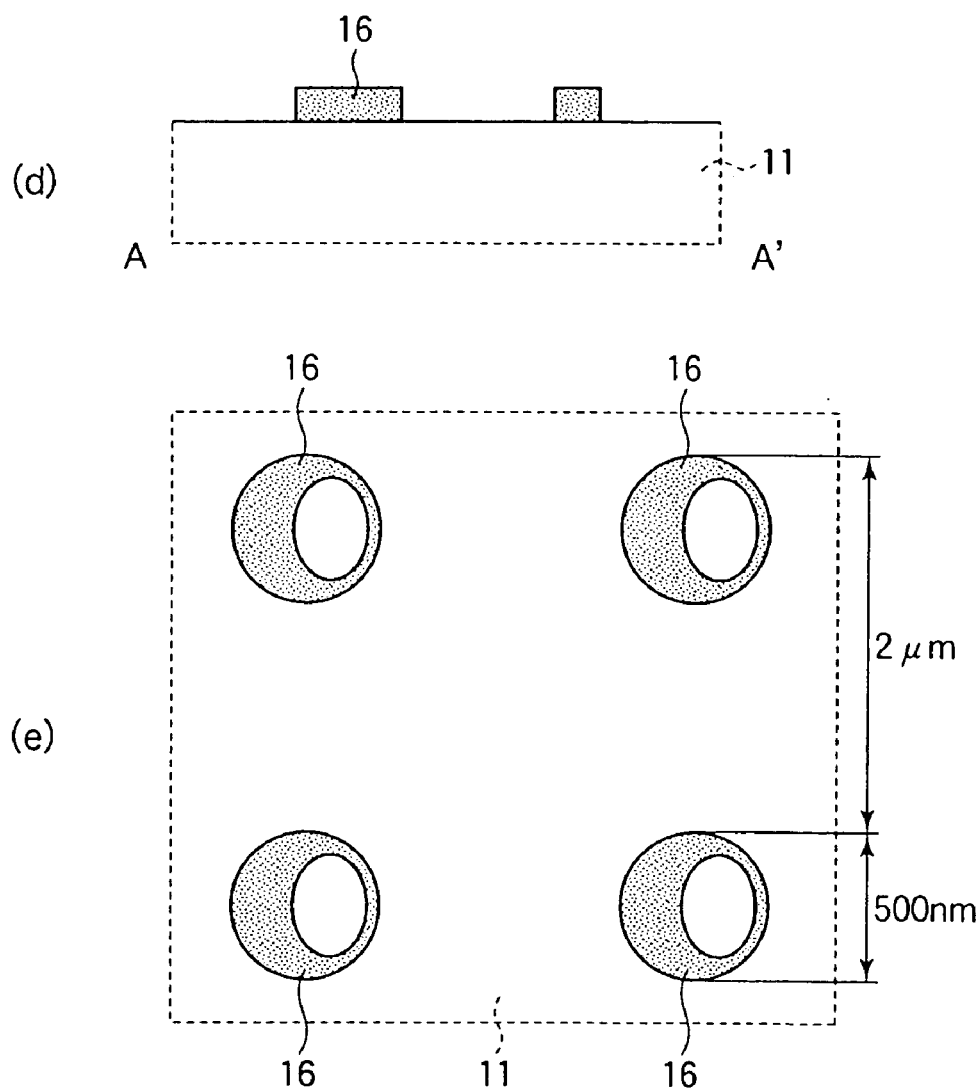
FIGS. 3(d) and 3(e) are views describing the steps following FIG. 2(c) of the manufacturing of the magnetic ring unit according to the first embodiment of the present invention.
Figure 4:
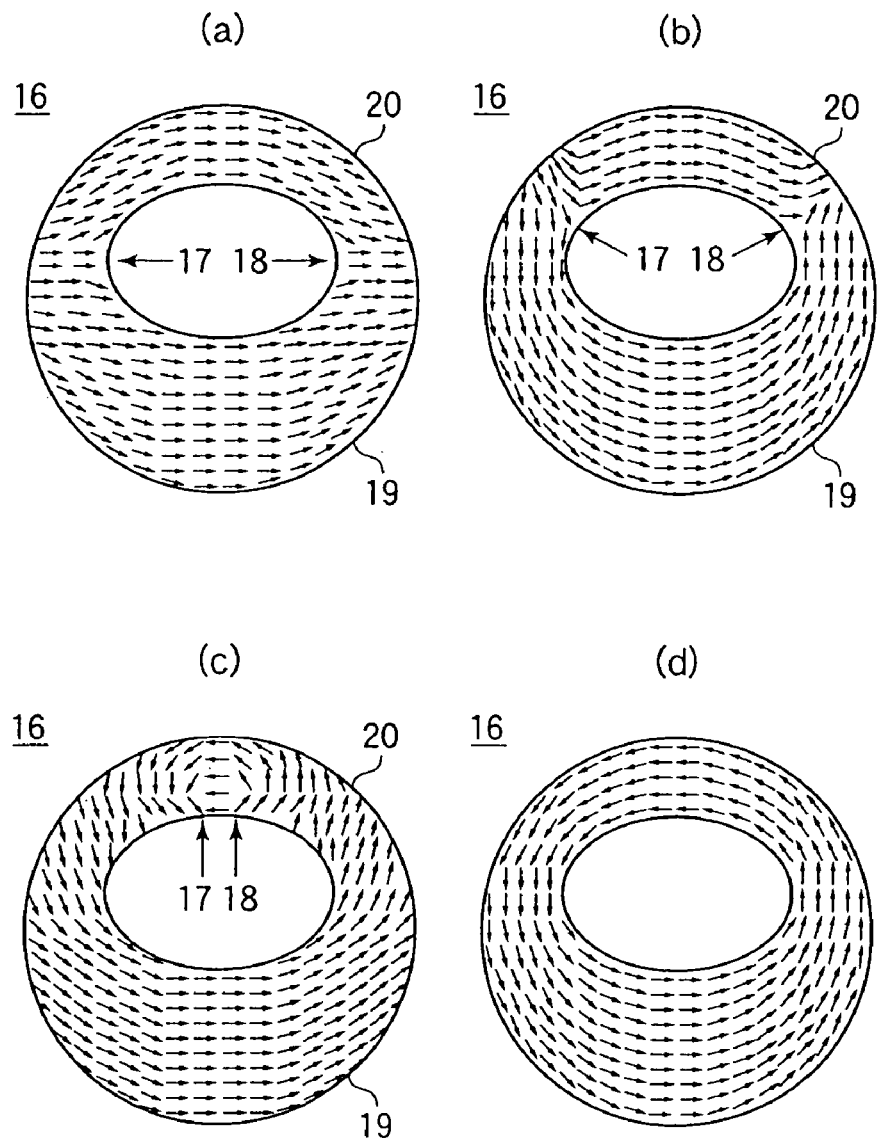
FIGS. 4(a) to 4(d) are diagrams describing the principles of control of the direction of rotation of the magnetic moment in the magnetic ring unit according to the first embodiment of the present invention.

In reference to FIGS. 2(a) to 6 a magnetic ring unit according to the first embodiment of the present invention is herein described. First, in reference to FIGS. 2(a) to 3(e), the manufacturing steps of the magnetic ring unit are described in the following.

See FIGS. 2(a) and 2(b).

FIG. 2(a) is a plan view and FIG. 2(b) is a schematic cross-sectional view along one-dotted chain line A–A' of FIG. 2(a).

First, a photoresist layer 12 is applied to a silicon substrate 11 so as to have a thickness of, for example, 100 nm which is then exposed to light and developed so that a recess 13 in ring form is created.

In this case, the outer diameter of recess 13 in ring form is, for example, 500 nm while the plan form of an inner protrusion 14 is an ellipse having a major axis of 350 nm and a minor axis of 250 nm so that the recess is of an eccentric ring form wherein the center of the ellipse shifts from the center of the outer diameter by 50 nm in the direction of the minor axis.

See FIG. 2(c).

Subsequently, a NiFe layer 15 is deposited on the entire surface by means of the sputtering method so as to have a thickness of, for example, 20 nm.

See FIG. 3(d).

Subsequently, photoresist layer 12 is removed and thereby, NiFe layer 15 that has been deposited in recess 13 in ring form becomes a magnetic ring unit 16.

See FIG. 3(e).

FIG. 3(e) is a plan view showing a condition where magnetic ring units 16 that have been fabricated in the above manner are aligned, wherein magnetic ring units 16 are aligned in a matrix form with pitches of approximately 2 μm.

Next, in reference to FIGS. 4(a) to 6, the principles of control of the direction of rotation of the magnetic moment in a magnetic ring unit is described.

See FIG. 4(a).

First, a magnetic field is applied in the direction perpendicular to the direction in which magnetic ring unit 16 is decentered and thereby, an opposed domain structure is formed where a domain 19 with a broad ring width and a domain 20 with a narrow ring width are opposed to each other via magnetic domain walls 17 and 18.

See FIG. 4(b).

Subsequently, magnetic domain walls 17 and 18 gradually shift to the side of domain 20 with a narrow ring width as the magnetic field is reduced to 0.

This is because magnetic domain wall energy e has a gradient ∇e on the circumference of the ring due to the eccentricity and therefore, the stress f (=−∇e) is applied to magnetic domain walls 17 and 18.

See FIGS. 4(c) and 4(d).

Subsequently, magnetic domain walls 17 and 18 shift further to the side of domain 20 with a narrow ring width and ultimately a magnetic vortex structure is formed.

At this time, the direction of rotation of the magnetic vortex structure agrees with the direction of the magnetic moment in domain 19 with a broad ring width.

When magnetic ring unit 16 in such a condition is observed by using an MFM (magnetic force microscope), it is confirmed that all magnetic ring units 16 have a magnetic vortex structure with the same direction of rotation.

Here, when the direction of application of an external magnetic field is reversed, the direction of the magnetic moment of domain 19 with a broad ring width becomes of a direction opposite to the case of FIG. 4(a) and thus the direction of rotation also becomes opposite.

Figure 5:
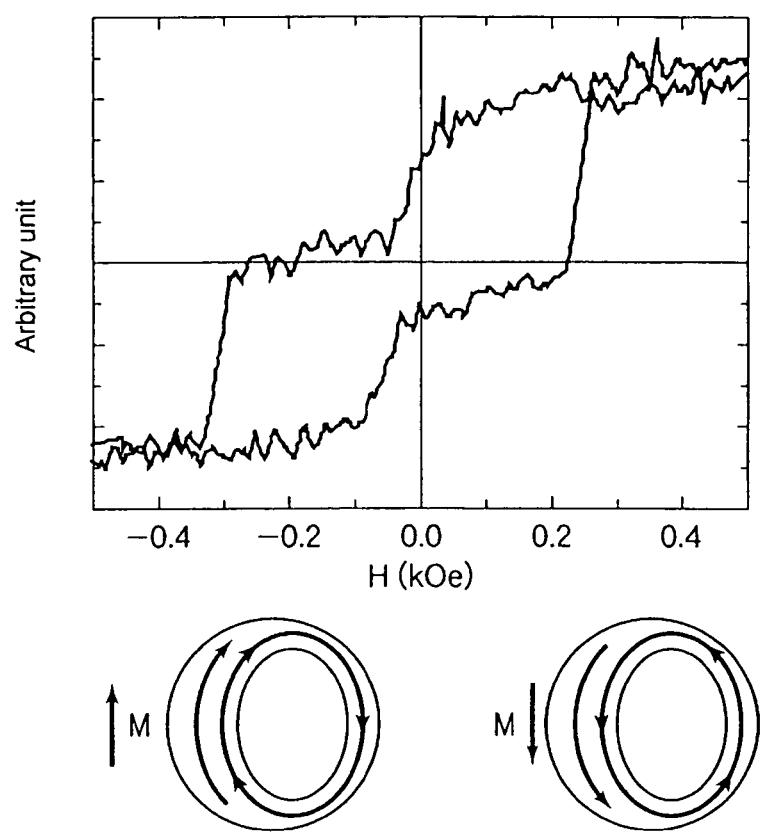
FIG. 5 is a graph describing the hysteresis characteristics of the magnetic ring unit according to the first embodiment of the present invention.

See FIG. 5.

FIG. 5 is a graph describing the hysteresis characteristics of a magnetic ring unit wherein it is understood that a stable magnetic vortex structure is formed by applying a magnetic field of 3 [kOe] and the magnetic vortex structure is maintained under an external magnetic field $H_{ex}$ of approximately 2 [kOe].

In the case where a current is made to flow in the vicinity of the magnetic ring unit in order to generate this magnetic field of 3 [kOe], it is possible to make the amount of this current 1 μA or less indicating that data can be magnetically written in with a sufficiently small current.

Figure 6:
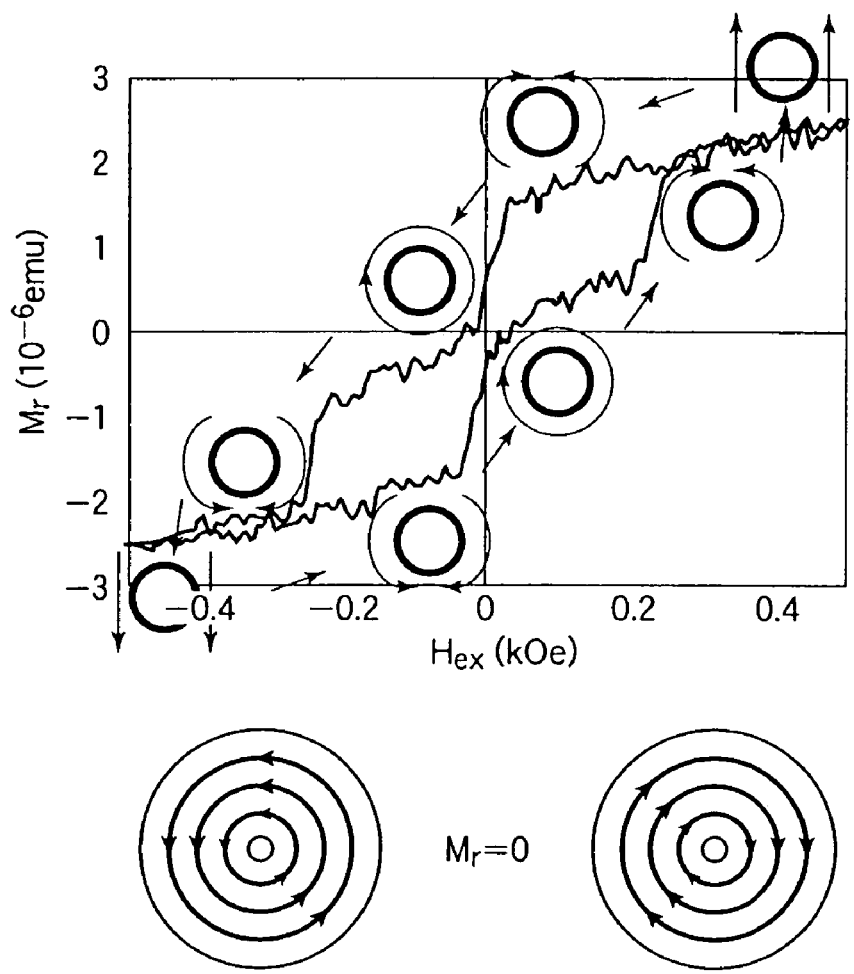
FIG. 6 is a graph describing the hysteresis characteristics of a non-eccentric magnetic ring unit according to the prior art.

See FIG. 6.

FIG. 6 is a graph describing the hysteresis characteristics of a non-eccentric magnetic ring unit according to the prior art, which has been shown for reference, wherein it is understood that remanent magnetization $M_r$ in the case where external magnetic field $H_{ex}$ has been reduced to 0 becomes approximately 0 ($M_r \approx 0$).

A magnetic ring array where magnetic ring units that are the same as the above are aligned can be utilized as a magnetic recording medium where a cantilever of an MFM may be used for read-out.

Figure 8:
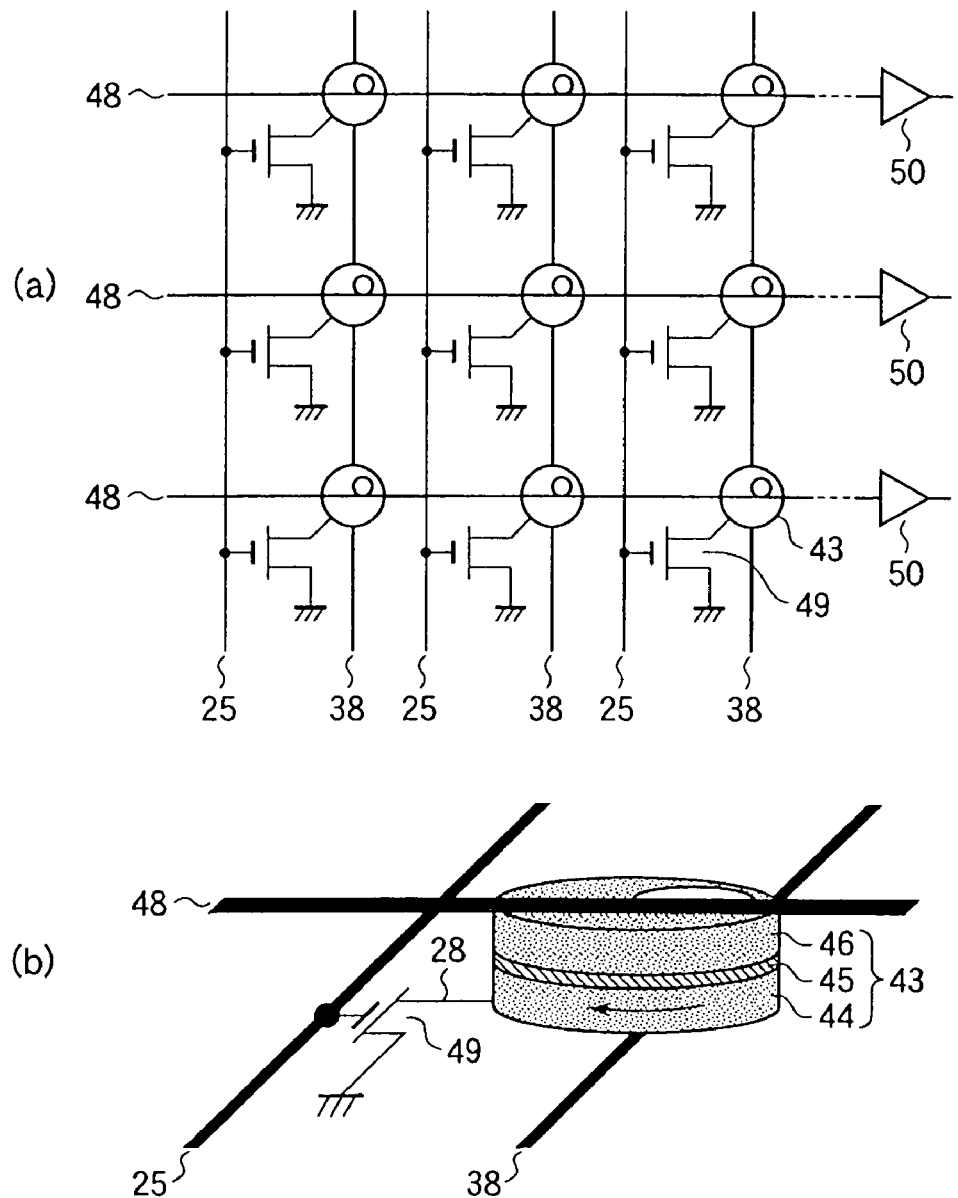
FIGS. 8(a) and 8(b) are diagrams describing the circuit configuration of the MRAM according to the second embodiment of the present invention.
Figure 9:
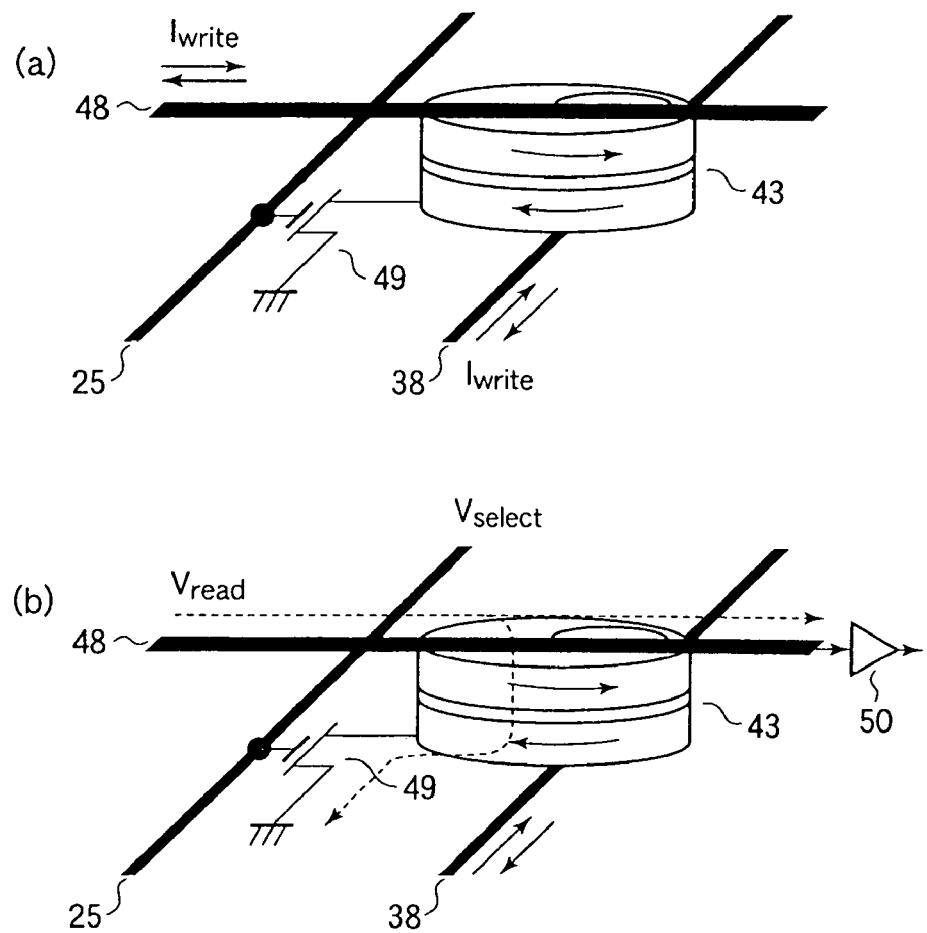
FIGS. 9(a) and 9(b) are diagrams describing write-in and read-out operations in the MRAM according to the second embodiment of the present invention.
Figure 10:
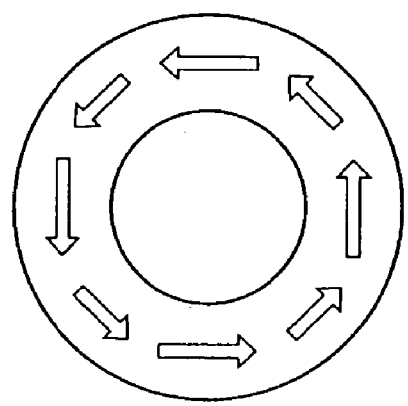
FIG. 10 is a diagram showing a conceptual configuration of magnetic moment distribution in a nanoring unit.
Figure 11:
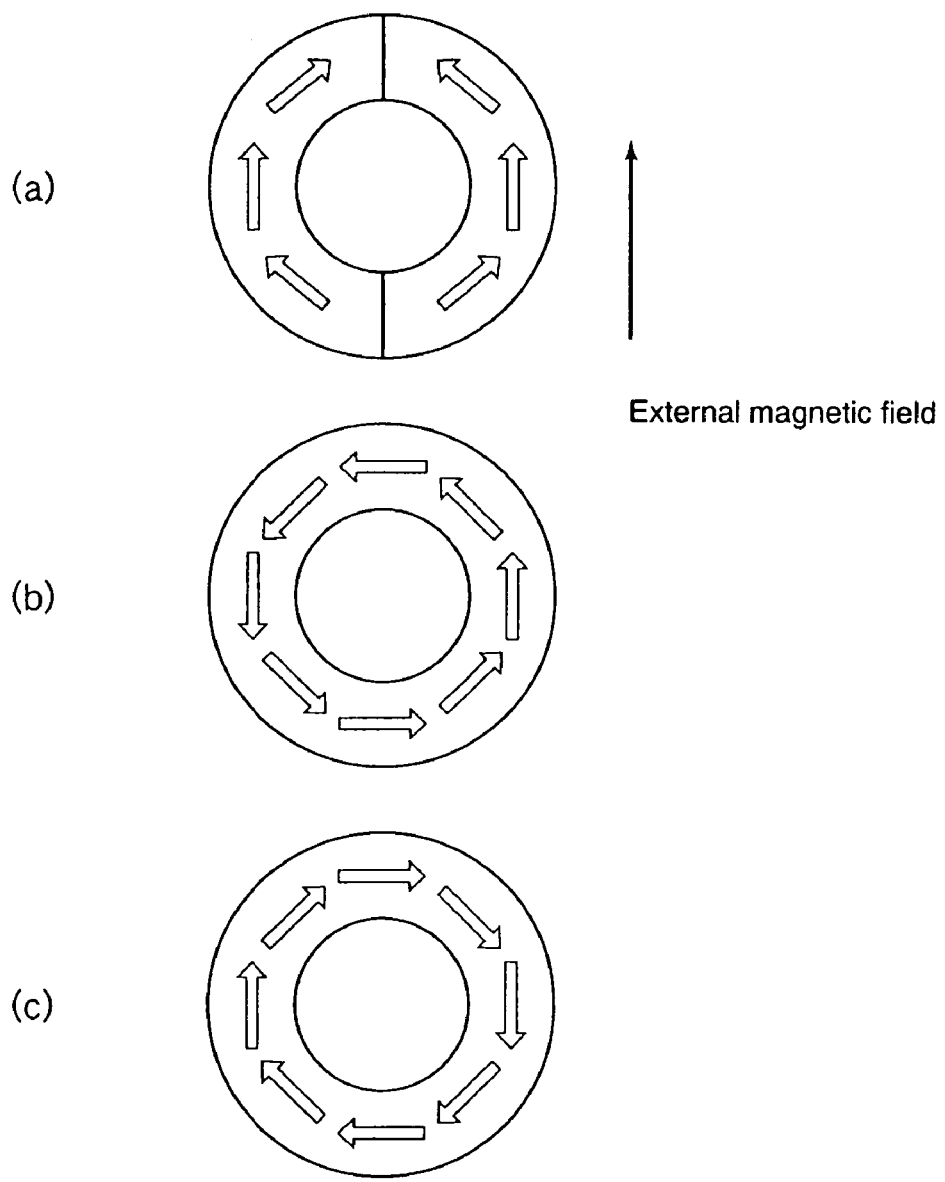
FIGS. 11(a) to 11(c) are diagrams describing the conversion from the opposed domain structure to the magnetic vortex structure in the nanoring unit.

Next, in reference to FIGS. 7 to 9, an MRAM according to the second embodiment of the present invention where a magnetic ring unit is used as a magnetic memory cell is described.

See FIG. 7.

FIG. 7 is a schematic cross-sectional view showing a main portion of an MRAM according to the second embodiment of the present invention wherein first a p-type well region 22 is formed in a predetermined region of an n-type silicon substrate 21 and n-type silicon substrate 21 is selectively oxidized so as to form an element isolation oxide film 23 and after that a gate electrode that becomes a sense line 25 for read-out is formed of WSi in an element formation region via a gate insulating film 24 so that this gate electrode is used as a mask for implanting ions such as As, or the like, and thereby, an n⁻-type LDD (lightly doped drain) region 26 is formed.

Subsequently, an SiO₂ film or the like, is deposited on the entire surface and anisotropic etching is carried out so that sidewalls 27 are formed, and after that, ions such as As or the like, are again implanted so that n⁺-type drain region 28 and n⁺-type source region 29 are formed. Then, after a thick first interlayer insulating film 30 has been formed of a TEOS (Tetra-Ethyl-Ortho-Silicate)-NSG film, contact holes reaching n⁺-type drain region 28 and n⁺-type source region 29 are created and then, W plugs 31 and 32 are formed by filling in these contact holes with W via Ti/TiN.

Subsequently, after TiN/Al/TiN has been deposited on the entire surface, for example, patterning is carried out so that a connecting conductor 33 and a ground line 34 that is connected to n⁺-type source region 29 are formed, and after that, a thick second interlayer insulating film 35 made of a TEOS-NSG film is again formed. Then a contact hole reaching connecting conductor 33 is created and W plug 36 is formed by filling this contact hole with W via Ti/TiN.

Subsequently, after TiN/Al/TiN has been deposited on the entire surface again, patterning is carried out so that a connecting conductor 37 and a word line 38 for write-in are formed, and after that, a thick third interlayer insulating film 39 made of a TEOS-NSG film is again formed. Then a contact hole reaching connecting conductor 37 is created and W plug 40 is formed by filling this contact hole with W via Ti/TiN.

Subsequently, after TiN/Al/TiN has been deposited on the entire surface again, patterning is carried out so that a lower electrode 41 is formed, and after that, a thick fourth interlayer insulating film 42 made of a TEOS-NSG film is again deposited, which is then flattened by means of CMP (chemical mechanical polishing) until lower electrode 41 is exposed.

Subsequently, in the same manner as in the above described first embodiment, a photoresist is applied so as to have a thickness of, for example, 100 nm which is then exposed to light and developed so that a recess in eccentric ring form is created. Then, after a NiFe layer 44 has been deposited so as to have a thickness of, for example, 20 nm, a tunnel insulating layer 45 made of Al₂O₃ has been deposited so as to have a thickness of, for example, 1 nm and a CoFe layer 46 has been deposited so as to have a thickness of, for example, 20 nm in a sequential manner, the photoresist is removed and thereby, a magnetic ring unit 43 having a NiFe/Al₂O₃/CoFe layered structure is formed.

In this case, the direction of eccentricity of magnetic ring unit 43 is made to agree with the direction approximately perpendicular to the direction of a synthesized magnetic field which is formed in the case where currents are made to flow through word line 38 for write-in and through the below described bit line 48.

Subsequently, a thin fifth interlayer insulating film 47 made of a TEOS-NSG film is again deposited, which is then flattened by means of CMP until CoFe layer 46 is exposed.

Subsequently, a multi-layered conductive layer having a TiN/Al/TiN structure is deposited on the entire surface which is then patterned to form a bit line 48 extending in the direction perpendicular to word line 38 for write-in and thereby, the basic structure of an MRAM is completed.

A high external magnetic field in the same direction as the direction of a synthesized magnetic field which is formed in the case where currents are made to flow through word line 38 for write-in and through bit line 48 is applied to the above described MRAM and thereby, the direction of magnetization of CoFe layer 46, which becomes a pinned layer, is provided.

See FIG. 8(*a*).

FIG. 8(*a*) is a diagram showing an equivalent circuit of the above described MRAM, wherein magnetic ring units 43 are placed at intersections of word lines 38 and bit lines 48 in the configuration with a structure where sense amplifiers 50 are connected to the ends of bit lines 48.

See FIG. 8(*b*).

FIG. 8(*b*) is a diagram showing a conceptual configuration of a magnetic memory cell wherein the upper portion of magnetic ring unit 43 is connected to bit line 48 and the lower portion of magnetic ring unit 43 is connected to $n^+$-type drain region 28 that forms access transistor 49 in the configuration.

See FIG. 9(*a*).

FIG. 9(*a*) is a diagram showing a conceptual configuration of a magnetic memory cell at the time of write-in wherein write-in is carried out on magnetic ring unit 43 by making currents, of which the values are lower than those that break the magnetic vortex structure of CoFe layer 46, flow through bit line 48 and through word line 38 for write-in in the condition where sense line 25 is biased to 0 while access transistor 49 has been turned off, so that the generated synthesized magnetic field determines the direction of rotation of NiFe layer 44 and thus data of "1" or "0" is written in depending on the direction of rotation of NiFe layer 44 being the same direction with or the opposite direction of CoFe layer 46.

See FIG. 9(*b*).

FIG. 9(*b*) is a diagram showing a conceptual configuration of a magnetic memory cell at the time of read-out, wherein read-out of data that has been written in magnetic ring unit 43 is carried out on magnetic ring unit 43 by applying $V_{read}$ to bit line 48 in the condition where $V_{select}$ is applied to sense line 25 and access transistor 49 has been turned on, so that the current that flows through bit line 48 is detected by sense amplifier 50.

In this case, when the direction of rotation of NiFe layer 44 is the same direction as the direction of rotation of CoFe layer 46, a low resistance is gained. When the direction of rotation of NiFe layer 44 is the opposite direction of the direction of rotation of CoFe layer 46, a high resistance which is greater than the low resistance by, for example, 10% to 100% is gained and therefore, the record of one bit can be read out by determining the amount of current.

As described above, according to the second embodiment of the present invention, a magneto-resistive effect element is formed of magnetic ring unit 43 in eccentric ring form and therefore, the direction of rotation of magnetization can be controlled with high reproducibility only by applying an external magnetic field. Thereby it becomes possible to perpetuate memory retention as well as to increase the density of an MRAM.

Though the respective embodiments of the present invention are described above, the present invention is not limited to the configuration or the condition described in each embodiment, but rather, a variety of modifications are possible.

For example, though in each of the above described embodiment the inner form of the eccentric ring is elliptical where the direction of eccentricity is in the direction of the minor axis of the ellipse, the direction of the eccentricity may be the direction of the major axis of the ellipse.

In addition, though in each of the above described embodiment the inner form of the eccentric ring is elliptical, it may be a completely round form and moreover it may be a polygonal form, that is to say, any form is acceptable as long as the center of the inner diameter is decentered from the center of the outer diameter.

In addition, though in each of the above described embodiment the outer form of the eccentric ring is completely round, it is not limited to a completely round form but rather, may be an elliptical form or furthermore, may be a polygonal form.

In addition, though in the above described first embodiment the magnetic ring is formed of NiFe, it is not limited to NiFe but rather, a magnetic body exhibiting soft magnet such as Fe, FeSi, FeAlSi, Co, Ni, CoFe, CoFeB, $La_{1-x}Sr_xMnO_3$, $La_{1-x}Ca_xMnO_3$ and GaAsMn may be used, and furthermore, it may be formed of a multi-layered structure such as NiFe/Co and the like instead of a single-layered structure.

In addition, though in the above described second embodiment the magnetic ring unit is formed of a NiFe/$Al_2O_3$/CoFe structure, the combination of the compositions or composition ratios of the pair of magnetic rings is arbitrary in a manner where the magnetic ring formed of the material having a relatively high coercive force is used as the pinned layer while the magnetic ring formed of the material having a relatively low coercive force is used as the free layer.

In this case, magnetic bodies forming the pair of magnetic rings may be appropriately combined selecting from magnetic bodies having a large magnetic moment such as Fe, Co, Ni, NiFe, CoFe, CoFeB, $CrO_2$, $La_{1-x}Sr_xMnO_3$ and $La_{1-x}Ca_xMnO_3$.

In addition, though in the above described second embodiment the pair of magnetic rings is formed of single-layered magnetic bodies, at least one of the magnetic rings may be formed of a multi-layered structure such as NiFe/Co and the like.

In addition, though in the above described second embodiment the magnetic ring unit is formed of a TMR element, it may be formed of a GMR element. In this case, the tunnel insulating film made of $Al_2O_3$ may be replaced with a non-magnetic conductive layer such as Cu and the like.

In addition, though in the above described second embodiment a uniform external magnetic field is applied in a specific direction at the time when fixed magnetization is provided to the pinned layer that forms the magnetic ring unit, fixed magnetization may be provided to the pinned layer by making currents, of which the amounts are greater than those for providing magnetization to the free layer, flow through the word line and bit line.

In addition, though in the above described second embodiment the pinned layer and the bit line are connected to each other in the configuration at the time when the magnetic ring unit is formed of a NiFe/$Al_2O_3$/CoFe structure, the free layer and the bit line may be connected to each other in the configuration by reversing the layered structure.

In addition, though in the above described second embodiment the magnetic ring unit is formed of a NiFe/Al₂O₃/CoFe structure, an antiferromagnetic layer may be joined to the pinned layer side so that the direction of rotation of the pinned layer is more stably pinned by the fixed magnetization that has been provided to the antiferromagnetic layer.

In this case, a variety of antiferromagnets such as IrMn, PtMn, FeMn, Fe₂O₃, CrMnPt, ThCo, CrAs, NiMn, RhMn, PdPtMn, FeRh and the like can be used as the antiferromagnetic layer, which may be deposited in order, allowing the antiferromagnetic layer to make contact with the pinned layer, at the time when the magnetic ring unit is formed according to the lift-off method.

Here in this case, the film formation may be carried out in the condition where a magnetic field is applied or heat treatment may be carried out in the condition where a magnetic field is applied after the film formation in order to provide magnetization to the antiferromagnetic layer.

Furthermore, an antiferromagnetic layer may be locally provided so as to make contact with a portion of the pinned layer in a manner as described in the above Patent document 3.

In addition, though in the above described second embodiment the access transistors, the peripheral circuits and the like, are formed by use of a semiconductor integrated circuit device, the present invention is not limited to a semiconductor integrated circuit device but rather, switching elements, peripheral circuits and the like, may be formed by a superconducting circuit device using Josephson junctions.

In addition, though in the above described second embodiment a magnetic memory cell of the MRAM is formed of a magnetic ring unit made up of free layer/tunnel insulating layer/pinned layer, the present invention is not limited to an MRAM but rather, a magnetic sensor having data retention ability may be formed of a similar magnetic ring unit including a GMR structure.

In addition, though in each of the above described embodiment the outer diameter of the eccentric ring is 500 nm, 500 nm is merely an example but rather, the outer diameter is miniaturized as the lithographic technology advances while fabrication of an eccentric ring having an outer diameter of approximately 100 nm is possible in a laboratory even at the present time and accordingly, it is possible to apply the present invention to a nanoring unit.

According to the present invention, a magnetic ring unit is in an eccentric ring form so that fabrication of a magnetic ring unit that can control the direction of rotation with high reproducibility becomes possible only by using a lift-off process and thereby, the present invention greatly contributes to the implementation of a magnetic recording device or magnetic memory device with a high density that is not effected by the limitation of miniaturization due to the magnetic interaction.

What is claimed is:

1. A magnetic ring unit, characterized by having at least a magnetic ring in eccentric ring form wherein the center of the inner diameter is located at a decentered position relative to the center of the outer diameter.

2. The magnetic ring unit according to claim 1, characterized in that said magnetic ring in eccentric ring form comprises a pair of magnetic rings having coercive forces that are different from each other and in that a non-magnetic layer is intervened between said pair of magnetic rings.

3. A magnetic memory device that comprises: magneto-resistive memory elements on a semiconductor substrate, which are respectively placed in intersection regions of word lines and bit lines placed in the directions crossing each other and where first magnetic layers of which the direction of rotation of magnetization is variable and second magnetic layers of which the direction of rotation of magnetization is fixed are layered via non-magnetic intermediate layers; and access transistors of which the gates are sense lines placed in the direction that crosses said bit lines, wherein the magnetic memory device is characterized in that each of said magneto-resistive memory element is formed at least of: a first magnetic ring in eccentric ring form where the center of the inner diameter is located at a decentered position relative to the center of the outer diameter; a second magnetic ring in eccentric ring form having a coercive force greater than that of said first magnetic ring; and a non-magnetic layer provided between said first and second magnetic rings.

* * * * *